United States Patent [19]

Renner et al.

[11] Patent Number: 4,862,076
[45] Date of Patent: Aug. 29, 1989

[54] TEST POINT ADAPTER FOR CHIP CARRIER SOCKETS

[76] Inventors: Robert E. Renner, 16017 N. 48th Ave., Glendale, Ariz. 85306; David A. Kutz, 4632 W. Julie Dr., Glendale, Ariz. 85308

[21] Appl. No.: 206,983

[22] Filed: May 26, 1988

Related U.S. Application Data

[63] Continuation of Ser. No. 876,070, Jun. 19, 1986, abandoned.

[51] Int. Cl.⁴ .................... G01R 31/02; H01R 23/72
[52] U.S. Cl. .................... 324/158 F; 324/73 PC; 439/68
[58] Field of Search .......... 324/158 F, 158 P, 73 PC; 439/68, 69, 70, 71, 72, 73, 74

[56] References Cited

U.S. PATENT DOCUMENTS 4,536,955 8/1985 Gudgeon .................... 439/68

FOREIGN PATENT DOCUMENTS 0156479 12/1979 Japan .................... 324/158 F

Primary Examiner—Ernest F. Karlsen

[57] ABSTRACT

This arrangement provides for attaching test or probe leads for such instruments as a logic analyzer to a leaded chip carrier. This arrangement provides for terminating each chip carrier lead to a metallic post upon which a logic probe or other test apparatus may be mechanically attached to make electrical connection. Since leaded chip carriers have their contact leads closely spaced, this arrangement expands this distance between leads to a suitable distance for connecting test probes. In this manner, the semiconductor chip may be functionally tested as part of a circuit on a printed wiring card.

7 Claims, 1 Drawing Sheet

TEST POINT ADAPTER FOR CHIP CARRIER SOCKETS

This is a continuation of co-pending application Ser. No. 876,070 filed on June 19, 1986, now abandoned.

BACKGROUND OF THE INVENTION

This invention pertains to electronic testing of socket mounted semiconductor chips and more particularly to electronic testing of chips in sockets with a large number of leads which are closely positioned.

One packaging type for integrated circuits is a leaded chip carrier (LCC) type. The LCC has leads on all four sides with spacing in between of 0.050 inch. Sockets for mounting a chip carrier to a printed wiring card do not provide any means for attaching testing apparatus leads. The chip carrier itself does not allow for physically attaching any test probe apparatus. Most test leads, such as logic analyzer probes, require 0.100 inch spacings between test points.

Another type of integrated circuit package is the dual in-line package (DIP). The DIP chips have leads on only two sides with pins spaced at 0.100 inch. Commercially available DIP clips (like clothes pins) may be clipped directly onto the chip leads in order to perform testing. These clips provide relatively long pins to which a logic probe may be attached. No clip type device can be adapted to a four sided LCC package when the LCC package is mounted in a suitable socket.

SUMMARY OF THE INVENTION

A test point adaptor permits connection of a test probe to the leads of a semiconductor chip which is mounted in a leaded chip carrier. Electrical connection may not be made directly to the semiconductor chip while it is mounted in the leaded chip carrier.

The test point adaptor includes a circuit board which has a number of conductive paths. Each conductive path is connected between an inner point of the circuit board and an outer point of the circuit board.

A first connector array is mounted to the circuit board. The first connector array has a number of terminal pins. Each of the terminal pins is connected to a corresponding inner point of a particular conductive path. The first connector array is also connected to the leaded chip carrier which contains the semiconductor chip.

The test point adaptor also has a second connector array. The second connector array is mounted to the circuit board. The second connector array has a number of terminal pins, each of which is connected a corresponding outer point of a corresponding conductive path.

The test probe may now be connected to any of the terminal pins of the second connector to obtain electrical access for testing the semiconductor chip which is mounted in the leaded chip carrier.

A BRIEF DESCRIPTION OF THE DRAWINGS

DESCRIPTION OF THE PREFERRED EMBODIMENT

Figure 1:
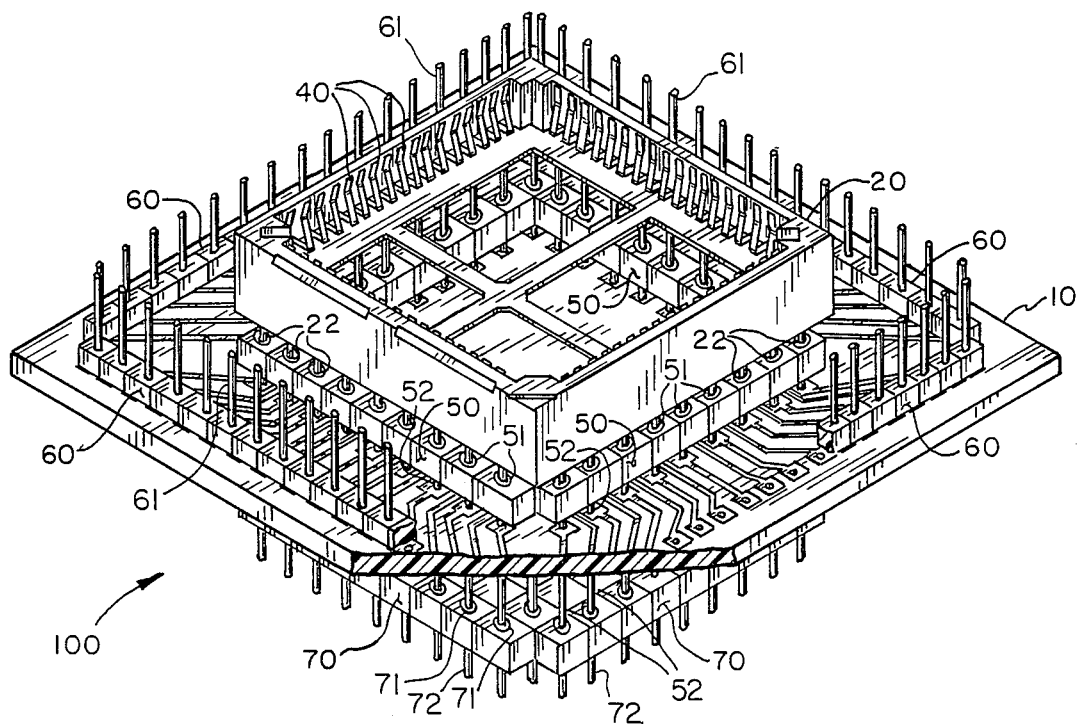
FIG. 1 is an assembly drawing of test point adaptor embodying the principles of operation of the present invention.
Figure 2:
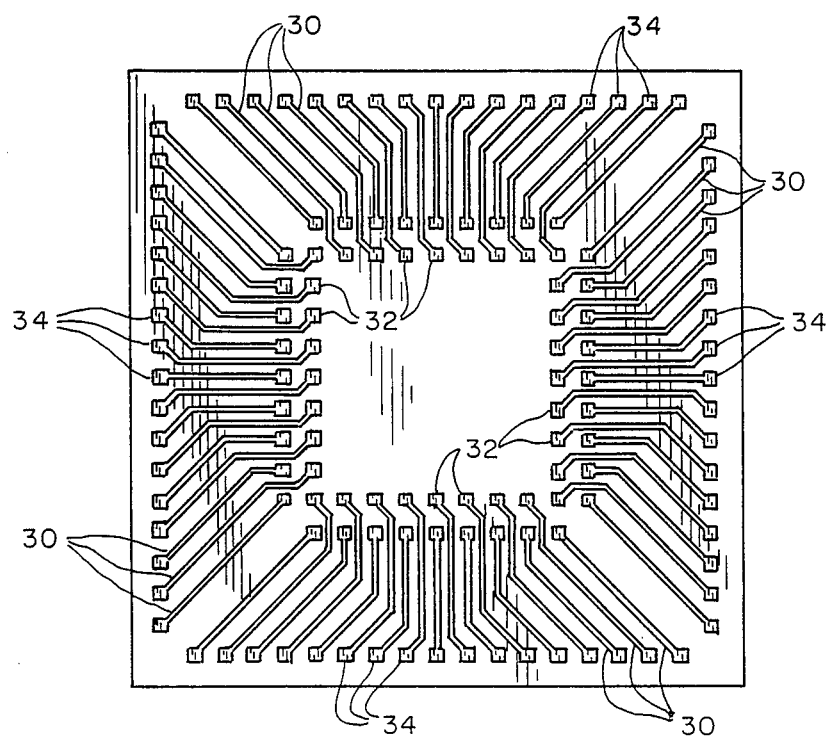
FIG. 2 is a layout of the foil paths of the printed wiring card of FIG. 1.

Referring to FIGS. 1 and 2, a chip carrier 20 is shown mounted on a test point adaptor 100. The printed wiring card 10 is an approximately two (2) inch square. The chip carrier 20 is approximately one and three-sixteenths inch square. There are seventeen (17) connection points on each side of the chip carrier square. The printed wiring card 10 allows electrical contact to be make along the two inch square side.

The printed wiring card 10 has foil paths 30 which allow widening of the distance between conductors 40 on the chip carrier 20 from 0.050 inch to 0.100 inch required for attaching a logic probe. The printed wiring card 10 includes a plurality of foil paths 30 connecting respective inner foil pads 32 to outer foil pads 34. Each foil pad 32 and 34, includes a centrally located hole (not shown) extending thru the printed wiring card 10. A plurality of terminal strip devices 50 are installed on the printed wiring card 10. Each terminal strip device includes a row of pin receiving portions or sockets 51 and a row of pins 52. Each socket 51 is integrally joined to an associated terminal pin 52 which extend outward directly opposite from its associated socket 51.

Each pin 52 is arranged to be inserted through a respective drilled hole of each inner foil pad 32. The inner foil pads 32 are grouped into two side-by-side rows on each side of a square perimeter. The inner row accepts an eight pin terminal strip device 50 and the outer row accepts a nine pin terminal strip device 50. These pin strips are manufactured by Samtec and are part no. SS-101-G-9.

Electrical connection is made between the pins 52 and the foil pads 32 by soldering. This soldering operation also provides for mechanical stability of the terminal strip devices 50 and the printed wiring card 10.

The outer foil pads 34 are arranged into four linear groups with each group extending longitudinally along a respective perimeter edge of wiring card 10. Terminal strip devices 60 having upper and lower pins 61 are mounted to the printed wiring card 10 by having the lower pins 61, (not shown), inserted through a respective and associated drilled hole on the top of wiring card 10, thereby, allowing each lower pin 61 to extend thru the circuit card and exit from an associated foil pad 34 on the bottom of the circuit card. These large terminal strip pins are part no. TSW-136-070-G-S manufactured by SAMTEC. A strip of these terminal strip devices 60 include seventeen pins (17). The upper pins 61 are a sufficient distance apart (0.100 inch) to permit the connection of test probes to test the functions of the semiconductor chip (not shown) contained in the chip carrier 20. A test probe such as a part no. 010-6451-00 may be connected to upper pins 61. The test probe mentioned above is manufactured by the Tektronics Corporation and may be plugged into a logic analyzer model no. 7D01 also manufactured by Tektronics.

The lower pins 61 of the terminal strip device 60 are soldered to a respective foil pad 34. This soldering also provides for a stable connection of terminal strip devices 60 to the printed wiring card.

Next, the chip carrier 20 may be inserted into the terminal strip devices 50. The integrated circuit chip (not shown) may have been previously inserted into the chip carrier 20 or chip carrier 20 may be removed and another chip fitted into the chip carrier 20. The pins 22 of the chip carrier 20 must be carefully aligned with the female opening of the terminal strip devices 50, so that the chip carrier pins 22 do not flex or bend and are all evenly seated and the chip carrier 20 urged downward inserting each pin 22 into a respective and associated socket 51 to make sufficient electrical contact.

Lastly, a third set of terminal strip devices 70 identical to terminal strip devices 50, have their sockets 71 connected to a respective and associated pin 52 of terminal strip devices 50. Terminal strip devices 70 are part no. SS-101-G-2 and are also manufactured by Samtec. The pins 72 of terminal strip devices 70 extend from the bottom of printed wiring card 10 and facilitate the mounting of the completed adaptor assembly 100 containing the chip carrier 20 to a master printed wiring card (not shown), so that the resulting master printed wiring card assembly may be tested and the semiconductor chips easily inserted, removed or changed.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A test point adaptor for permitting an electrical connection of a test probe apparatus to a semiconductor chip mounted in a semiconductor chip carrier, said chip carrier including a plurality of connecting pins electrically connected to said semiconductor chip extending from said chip carrier, said test point adaptor comprising:
   a circuit board having a plurality of conductive foil paths, each conductive foil path connecting a corresponding inner foil pad to a corresponding outer foil pad;
   first terminal means connected to said circuit board, said first terminal means including a plurality of electrically conductive pin members, each pin member electrically connected to a corresponding inner foil pad;
   said first terminal means further including a plurality of electrically conductive pin accepting members, each pin member electrically connected to an associated first terminal means pin member and each pin accepting member is arranged to accept a respective and associated chip carrier connecting pin, therein, connecting said circuit board and said foil paths to said chip carrier with said semiconductor chip; and
   second terminal means connected to said circuit board, said second terminal means including a plurality of electrically conductive pin members, each of said second terminal means pin members connected to a corresponding outer foil pad of said circuit card, said second terminal means pin members providing for selective electrical connection of said test probe apparatus to said semiconductor chip in said leaded chip carrier.

2. A test point adaptor as claimed in claim 1, wherein there is further included third terminal means including a plurality of electrically conductive pin accepting members, each of said third terminal means pin accepting members connected to a corresponding pin member of said first terminal means, and said third terminal means further including a plurality of pin members electrically connected to an associated pin accepting member, each of said pin members of said third terminal means being further connectable to printed wiring card means.

3. A test point adaptor as claimed in claim 2, said printed wiring card means is a master printed wiring card assembly used for in circuit testing of said semiconductor chip.

4. A test point adaptor as claimed in claim 3, said first terminal means comprises a plurality of terminal strip devices each of said terminal strip devices including at least one electrical socket for accepting a pin therein, and a terminal pin electrically connected to an associated socket extending from said terminal strip device.

5. A test point adaptor as claimed in claim 4, said connection of said terminal strip device terminal pins to each of said inner foil pads includes a soldered connection.

6. A test point adaptor as claimed in claim 5, said second terminal means comprises a plurality of terminal strip devices, each said terminal strip device including first and second terminal pins, and each first terminal pin electrically connected to an associated second terminal pin, and each second terminal pin connected to a corresponding outer foil pad, and each first terminal pin arranged to accept and make an electrical connection to said test probe apparatus.

7. A test point adaptor as claimed in claim 6, said connection of said terminal strip device second terminal pins to each of said outer foil pads includes a soldered connection.

* * * * *